(12) United States Patent
Thompson et al.

(10) Patent No.: US 7,683,465 B2
(45) Date of Patent: Mar. 23, 2010

(54) INTEGRATED CIRCUIT INCLUDING CLIP

(75) Inventors: Vasile Romega Thompson, Tempe, AZ (US); Zhi-Gang Bai, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 221 days.

(21) Appl. No.: 11/856,239

(22) Filed: Sep. 17, 2007

(65) Prior Publication Data

US 2008/0042246 A1    Feb. 21, 2008

Related U.S. Application Data

(62) Division of application No. 11/142,077, filed on May 31, 2005, now Pat. No. 7,271,469.

(51) Int. Cl.
*H01L 23/48* (2006.01)

(52) U.S. Cl. ................ 257/666; 257/676; 257/E23.031
(58) Field of Classification Search ................ 257/666, 257/676, 727, E23.052, E23.031, E21.51
See application file for complete search history.

(56) References Cited

U.S. PATENT DOCUMENTS 7,462,887 B2 * 12/2008 Koike et al. ................ 257/177
2005/0012183 A1    1/2005 Chow et al.

* cited by examiner

*Primary Examiner*—Roy K Potter
(74) *Attorney, Agent, or Firm*—Ingrassia, Fisher & Lorenz, P.C.

(57) ABSTRACT

A semiconductor device is provided that includes a leadframe, a die, and a clip. The leadframe has a flag and a power pad. The die is coupled to the flag. The clip comprises a die retaining section and a pad section. The die is coupled to the die retaining section, and the pad section extends from the die retaining section. The pad section is coupled to the power pad.

20 Claims, 3 Drawing Sheets

INTEGRATED CIRCUIT INCLUDING CLIP

CROSS REFERENCE TO RELATED APPLICATION

This application is a divisional of Ser. No. 11/142,077 filed on May 31, 2005.

FIELD OF THE INVENTION

The present invention generally relates to integrated circuits and packaged integrated circuits, and, more particularly, to a method of making an integrated circuit.

BACKGROUND OF THE INVENTION

An integrated circuit ("IC") die is a small device formed on a semiconductor wafer, such as a silicon wafer and is typically cut from the wafer, coupled to a flag portion of a leadframe, and electrically connected to power pads of the leadframe via a wirebonding process. The wirebonding process may also be used to cross connect bond pads of the die or to cross connect other leads of the leadframe. The die, bond wires, and leadframe are then encapsulated and singulated from other dice to form a single packaged device.

As technology has advanced, the demand has increased for ICs that are more dense and that do not increase the size or footprint of the packaged device. Additionally, the desire has remained for an increased number of inputs and outputs between the IC and leadframe power pads. Consequently, the densities of connections between the IC die and the leadframe has increased. To produce the desired devices, fine pitch and ultra-fine pitch wire bonding have been utilized, and the bond wire diameters have decreased.

Although the aforementioned changes to the wirebonding technologies have been effective in producing operable ICs, they have certain drawbacks. For example, the decreased pitch and wire diameter may cause difficulties in the handling and the bonding of the bond wire. In particular, the bond wires may unintentionally short to other conductive structures of the packaged device, such as other bond wires, pads, leads, or the die. The bond wires may be more susceptible to shorting during IC die encapsulation as, for example, from "sweeping," where the injection or transfer of the liquid molding encapsulant may move the bond wires against other conductive structures. To decrease the shorting effect, insulated or coated wires have been used; however, these types of wires are difficult to bond to the bond pads. Some approaches have been used to remove a portion of the wire coating. But, the removal process may require additional equipment, which may increase production time and costs.

Accordingly, it is desirable to have a method for manufacturing an IC die that is simple and cost-efficient to implement. Moreover, it is desirable for the method to yield high quality devices with decreased shorting effects. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Although the invention is shown embodied in a Quad Flat No-lead (QFN) type package, those of ordinary skill in the art will readily understand the details of the invention and that the invention is applicable to other package types. Furthermore, there is no intention to be bound by any theory presented in the preceding background of the invention or the following detailed description of the invention.

Figure 1:
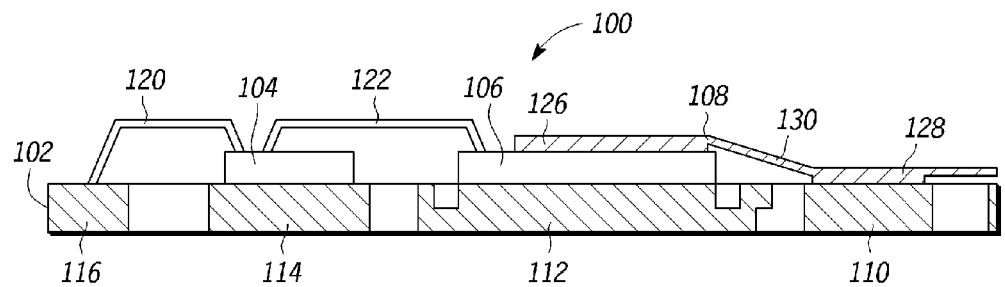
FIG. 1 is a cross-sectional view of an exemplary package device.

FIG. 1 is a cross-sectional view of an exemplary embodiment of a single package device 100. Package device 100 includes a leadframe 102, a control die 104, a power die 106, and a clip 108.

Figure 2:
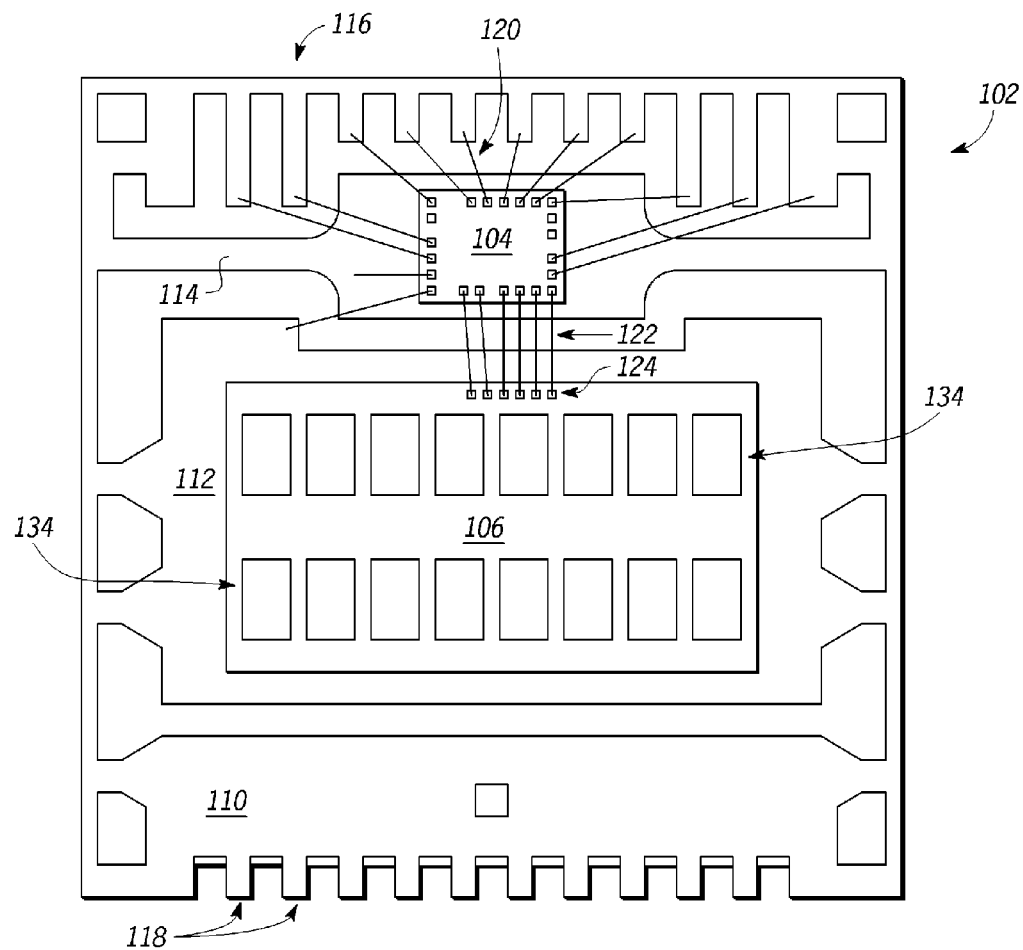
FIG. 2 is a top view of an exemplary leadframe having an exemplary power die and exemplary control die coupled thereto that may be implemented as part of the package device depicted in FIG. 1.

FIG. 2 is a top view of a section of an exemplary leadframe 102 having power die 106 and control die 104 coupled thereto. Leadframe 102 includes a power pad 110, a power die flag 112, a control die flag 114, and a plurality of input/output connectors 116 each integrally formed. Power pad 110 is configured to be electrically coupled to a non-illustrated external power source to receive power therefrom. In this regard, power pad 110 may include a plurality of connectors 118. It will be appreciated that power pad 110 may have any one of numerous shapes, such as, for example, an elongated body, as shown in FIG. 2.

Power die flag 112 is configured to receive power die 106 and secures power die 106 thereto in any one of numerous conventional manners. In one example, solder is used to couple power die flag 112 to power die 106. Control die flag 114 is configured to receive control die 104. The two are coupled to one another in any one of a number of manners, such as, for example, in the same manner by which power die flag 112 and power die 106 are coupled.

Input/output connectors 116 are configured to communicate signals from an external device to control die 104. In this regard, control die 104 is electrically coupled to input/output connectors 116 using known techniques. In one exemplary embodiment, control die 104 and input/output connectors 116 are wirebonded to each other via bond wires 120, as shown in FIGS. 1 and 2. Control die 104 may receive signals to operate power die 106 and, thus, is electrically coupled to power die 106. For example, control die 104 may be wirebonded to power die 106 via bond wires 122. Bond wires 122 may be coupled to power die 106 through a plurality of bond pads 124.

Figure 3:
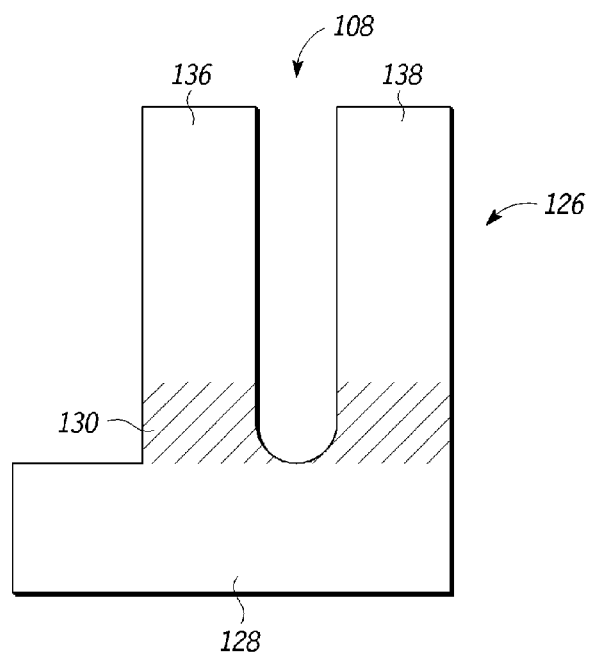
FIG. 3 is a top view of an exemplary clip that may be implemented as part of the semiconductor package depicted in FIG. 1.
Figure 4:
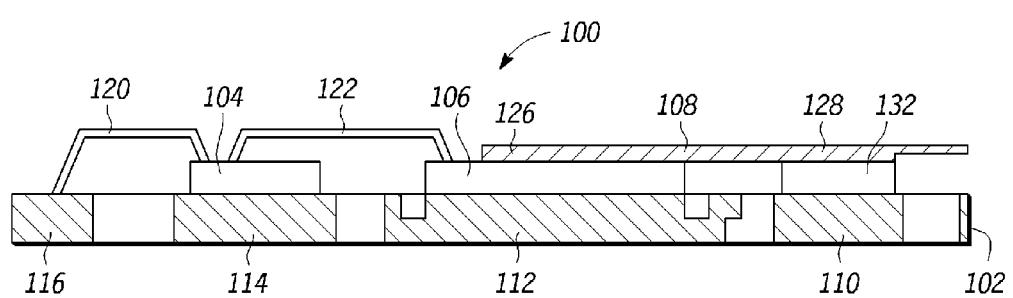
FIG. 4 is a cross-sectional view of another exemplary embodiment of package device.

Power die 106 is configured to provide power to device 100 for operation and thus, is electrically coupled to power pad 110. To this end, clip 108 (FIGS. 1 and 3) is employed to electrically couple power die 106 and power pad 110. FIG. 3 is a top view of clip 108 that includes a die retaining section 126 coupled to a pad section 128. Clip 108 may have any one of numerous configurations. In one exemplary embodiment, clip 108 is configured such that die retaining section 126 is raised relative to pad section 128, as shown more clearly in FIG. 1. In such case, die retaining section 126 and pad section 128 preferably have an offset that is substantially equal to the thickness of power die 106. Accordingly, die retaining section 126 and pad section 128 are connected to one another by an appropriately angled bridge 130. In another exemplary embodiment, die retaining section 126 and pad section 128 are level relative to one another, as shown in FIG. 4. In such case, an appropriately configured spacer 132 may be placed between pad section 128 of clip 108 and power pad 110.

Die retaining section 126 is configured to engage power die 106, such as, for example, by means of a plurality of bond pads 134 (shown in FIG. 2) formed on power die 106 and may have any one of numerous shapes. For example, die retaining section 126 may be a single flange or multiple flanges that extend from pad section 128. In one exemplary embodiment, as shown in FIG. 3, die retaining section 126 includes two flanges 136 and 138 that extend from pad section 128. Pad section 128 is configured to be coupled to power pad 110 and may have any suitable configuration. For example, as shown in FIG. 3, pad section 128 may be an elongated body configured to extend across power pad 110 (shown in FIG. 1)

Figure 5:
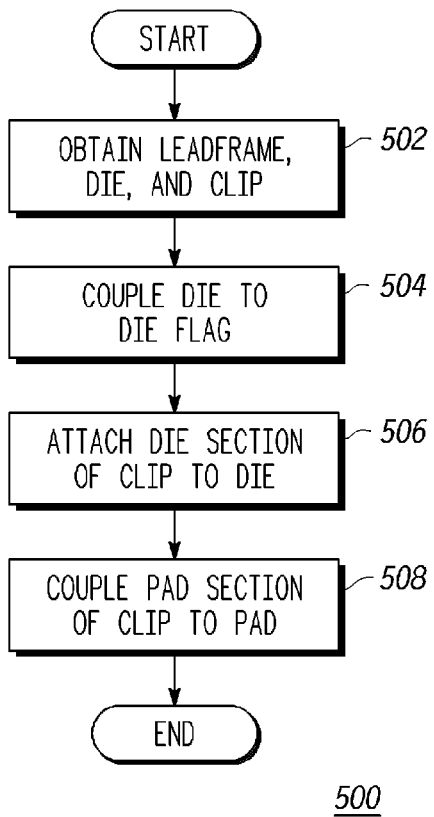
FIG. 5 is a flow diagram of an exemplary method for manufacturing the exemplary package devices depicted in FIG. 1.

Package device 100 may be manufactured in a number of ways. One exemplary embodiment of a manufacturing method 500 is depicted in FIG. 5. A leadframe, a die, and a clip, such as, for example, those depicted in FIGS. 1-3 are obtained (step 502). The die is then coupled to a die flag of the leadframe (step 504). A die retaining section of the clip is attached to the die (step 506), and a pad section of the clip is affixed to a power pad of the leadframe (step 508).

Step 502 may be performed in a number of ways. In one exemplary embodiment, the leadframe, die, and clip are obtained from, such as, for example, a separate manufacturer. In another embodiment, the leadframe, die, and clip are manufactured as part of method 500 in any conventional manner.

After step 502, the die is coupled to the die flag. In one exemplary embodiment, solder is deposited onto the die flag of the leadframe and the die is placed onto the deposited solder (step 504). Step 504 may also include the step of coupling a second die to the leadframe and coupling the second die to the first die. For example, the first die may be a power die and the second die may be a control die. In such an embodiment, solder is deposited onto a power die flag of the leadframe and a control die flag of the leadframe, and the power die is placed over the power die flag while the control die is placed over the control die flag. The control die is then coupled in a conventional manner to input/output connectors formed on the leadframe and to bond pads formed on the power die, such as, for example, by wirebonding.

Then, the die retaining section of the clip is attached to the die (step 506), and the pad section of the clip is affixed to the power pad (step 508). These steps may include depositing solder onto the die, depositing solder onto the power pad, and contacting the die retaining section and the pad section of the clip to the deposited solder. It will be appreciated that steps 506 and 508 may be performed simultaneously or in any order. For example, solder may be deposited simultaneously onto the die and the power pad, or in succession. Similarly, the die retaining section and the pad section may be contacted with the deposited solder simultaneously or in succession.

Step 506 may additionally include the step of applying a coating to the die that facilitates soldering. This step may be performed before the solder is deposited. The coating may be any one of numerous conductive materials that provides the die with a wettable surface. In one exemplary embodiment, the coating is three layers and includes aluminum, nickel deposited over the aluminum, and a gold flash over the nickel.

To ensure that the die retaining section and the pad section are fixed to the device, a reflow process may be performed after steps 506 and 508. For example, the device may be heated to a temperature that is above a melting point temperature of the solder to melt the solder and provide bonds between the clip, die, and leadframe.

Figure 6:
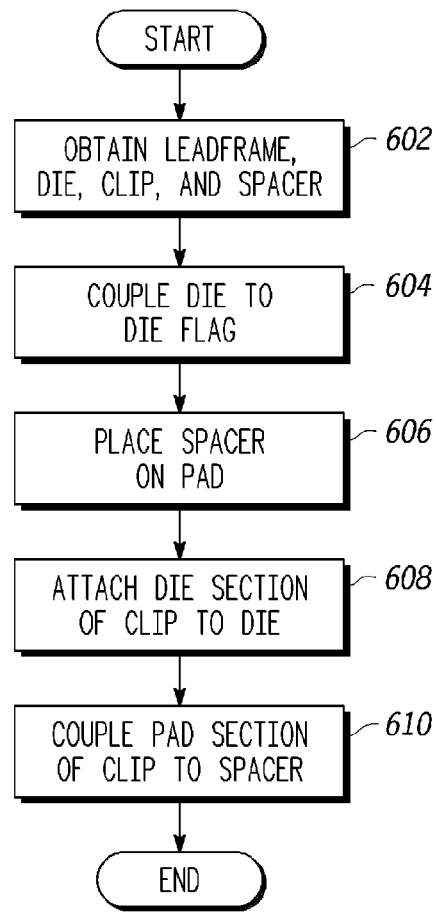
FIG. 6 is a flow diagram of an exemplary method for manufacturing the exemplary package devices depicted in FIG. 4.

FIG. 6 illustrates another exemplary method 600 of manufacturing package device 100. Here, a leadframe, a die, a clip, and a spacer, such as, for example, those depicted in FIGS. 2-4 are obtained (step 602). The die is coupled to the die flag of the leadframe (step 604). The spacer is placed over the power pad (step 606). The die retaining section of the clip is attached to the die (step 608). The pad section of the clip is affixed to the spacer (step 610).

Steps 602 and 604 may be performed in substantially the same manner as step 502 and 504, respectively. Step 606 may be performed in any suitable manner. For example, in one exemplary embodiment, step 606 includes the steps of depositing solder onto the power pad and contacting the spacer with the deposited solder. After step 606 is performed, the die retaining section of the clip is attached to the die (step 608), and the pad section of the clip is affixed to the spacer (step 610). These steps may include depositing solder onto the die, depositing solder onto the spacer, and contacting the die retaining section and pad section to the deposited solder. It will be appreciated that the steps 608 and 610 may be performed simultaneously or in any order. For example, solder may be deposited simultaneously onto the die and spacer, or in succession. Similarly, the die retaining section and spacer may be contacted with the deposited solder simultaneously or in succession. Additionally, a reflow process, similar to the process described above in method 500, may be performed after steps 608 and 610 to melt the deposited solder so that the clip, die, spacer, and leadframe are sufficiently attached to one another.

There has now been provided a semiconductor device that includes a leadframe, a die, and a clip. The leadframe has a flag and a power pad. The die is coupled to the flag. The clip comprises a die retaining section and a pad section. The die is coupled to the die retaining section, and the pad section extends from the die retaining section. The pad section is coupled to the power pad. In one exemplary embodiment, the die retaining section and the pad section are level relative to one another and the device further comprises a spacer disposed between the pad section of the clip and the power pad. The spacer may have a thickness that is substantially equal to a thickness of the die. In another exemplary embodiment, the die retaining section and the pad section of the clip are not level relative to one another and are coupled to one another by an angled bridge.

In still another exemplary embodiment, the die retaining section includes a first flange and a second flange, and the first flange and the second flange each extend from the pad section. In another exemplary embodiment, at least one of the leadframe and the clip comprises copper, nickel, palladium, and gold. In yet another exemplary embodiment, the die includes a coating comprising aluminum, nickel, and gold.

In another exemplary embodiment, a method is provided of forming a semiconductor device from a die, a leadframe having a flag and a power pad each integrally formed, and a clip having a die retaining section extending from a pad section. The method includes the steps of coupling the die to the flag, attaching the die retaining section of the clip to the die, and affixing the pad section of the clip to the power pad. In another exemplary embodiment, the step of coupling comprises depositing solder on the flag and contacting the die to the deposited solder. In still another exemplary embodiment, the step of attaching comprises depositing solder on the die and contacting the die retaining section of the clip to the deposited solder. In yet another exemplary embodiment, the step of affixing comprises depositing solder on the power pad and contacting the pad section of the clip to the deposited solder. In still yet another exemplary embodiment the steps of coupling, attaching, and affixing each comprise the steps of depositing solder. In another exemplary embodiment, the method includes melting the solder to couple the die to the leadframe, the die retaining section of the clip to the die, and the pad section of the clip to the power pad.

In another exemplary embodiment, a method is provided of forming a semiconductor device from a die, a leadframe having a flag and a power pad each integrally formed therein, a spacer, and a clip having a die retaining section extending from a pad section. The method includes coupling the die to the flag, placing the spacer of the spacer leadframe over the power pad, attaching the die retaining section of the clip to the die, and affixing the pad section of the clip to the spacer. In one exemplary embodiment, the step of coupling comprises depositing solder on the flag and contacting the die to the deposited solder. In another exemplary embodiment, the step of placing comprises depositing solder on the power pad and contacting the spacer to the deposited solder. In still another exemplary embodiment, the step of attaching comprises depositing solder on the die and contacting the die retaining section of the clip to the deposited solder. In still another exemplary embodiment, the step of affixing comprises depositing solder on the power pad and contacting the pad section of the clip to the deposited solder. In another exemplary embodiment, the steps of coupling, placing, attaching, and affixing each comprise the steps of depositing solder. In still yet another exemplary embodiment, the method includes melting the solder to couple the die to the leadframe, the spacer to the power pad, the die retaining section of the clip to the die, and the pad section of the clip to the spacer.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents

What is claimed is:

1. A semiconductor device, comprising:
   a leadframe having a flag and a power pad;
   a die coupled to said flag; and a clip, comprising:
      a die retaining section coupled to said die; and
      a pad section extending from said die retaining section, said pad section coupled to said power pad.

2. The semiconductor device of claim 1, wherein said die retaining section and said pad section are level relative to one another.

3. The semiconductor device of claim 2, wherein the device further comprises a spacer disposed between said pad section of said clip and said power pad.

4. The semiconductor device of claim 3, wherein said spacer has a thickness that is substantially equal to a thickness of said die.

5. The semiconductor device of claim 1, wherein said die retaining section is raised relative to said pad section.

6. The semiconductor device of claim 5, wherein said clip further comprises an angled bridge coupling said die retaining section to said pad section.

7. The semiconductor device of claim 1, wherein said die retaining section comprises a first flange and a second flange, said first flange and said second flange each extending from said pad section.

8. The semiconductor device of claim 7, wherein said die comprises a first row of bond pads and a second row of bond pads, and wherein said clip is positioned such that said first flange overlies said first row of bond pads and said second flange overlies said second row of bond pads.

9. The semiconductor device of claim 1, wherein at least one of said leadframe and said clip comprises copper, nickel, palladium, and gold.

10. The semiconductor device of claim 1, wherein said die includes a coating comprising aluminum, nickel, and gold.

11. A semiconductor device, comprising:
    a leadframe having a flag and a power pad;
    a power die having an upper surface and a lower surface, said lower surface coupled to said flag, and said upper surface having a plurality of bond pads thereon; and
    a clip electrically coupling said power pad to said power die, said clip comprising:
       a die retaining section bonded to said upper surface of said power die and electrically coupled to said plurality of bond pads; and
       a pad section bonded to said power pad.

12. The semiconductor device of claim 11, wherein said power die flag is substantially adjacent said power pad.

13. A semiconductor device according to claim 11, further comprising a spacer coupled between said pad section and said power pad.

14. A semiconductor device according to claim 13, wherein said spacer has a thickness substantially equivalent to the thickness of said power die.

15. A semiconductor device according to claim 11, wherein said clip further comprises an angled bridge joining said die retaining section to said pad section.

16. A semiconductor device according to claim 11, wherein said die retaining section comprises a flange.

17. A semiconductor device according to claim 16, wherein said flange has a length substantially equivalent to the length of said power die.

18. A semiconductor device according to claim 16, wherein the longitudinal axis of said flange is generally perpendicular to the longitudinal axis of said pad section.

19. A semiconductor device according to claim 11, wherein pad section comprises an elongated body having a length substantially equivalent to the length of said power pad.

20. A semiconductor device according to claim 11, wherein said power die comprises multiple rows of bond pads, and wherein said die retaining section comprises a plurality of flanges each bonded to a different one of said multiple rows of bond pads.

* * * * *